United States Patent [19]

Jaster et al.

[11] 4,047,561
[45] Sept. 13, 1977

[54] COOLING LIQUID DE-GASSING SYSTEM

[75] Inventors: Heinz Jaster; Fred W. Staub, both of Schenectady, N.Y.

[73] Assignee: General Electric Company, Schenectady, N.Y.

[21] Appl. No.: 673,463

[22] Filed: Apr. 5, 1976

Related U.S. Application Data

[62] Division of Ser. No. 515,838, Oct. 18, 1974, Pat. No. 3,989,102.

[51] Int. Cl.² ............................................. H01L 23/34
[52] U.S. Cl. ..................................... 165/32; 165/107; 165/DIG. 22; 310/53; 310/54; 313/12
[58] Field of Search ................. 165/107, DIG. 22, 32; 310/54, 53; 313/12

[56] References Cited

U.S. PATENT DOCUMENTS 3,835,919  2/1973  Lambrecht et al. ............ 165/107 X

FOREIGN PATENT DOCUMENTS 1,351,116  12/1963  France .............................. 165/107

Primary Examiner—Albert W. Davis, Jr.
Attorney, Agent, or Firm—Paul R. Webb, II; Joseph T. Cohen; Jerome C. Squillaro

[57] ABSTRACT

A closed loop forced liquid cooling system has provision for continuously separating dissolved gas from the cooling liquid. A gas separator is combined with a liquid-gas interface pressurizer to establish favorable temperature and/or low pressure conditions for preferential gas evolution. By preventing bubble formation in liquids cooling electronic and electrical equipment, dielectric breakdown of the cooling liquid is averted.

2 Claims, 5 Drawing Figures

Fig. 5.

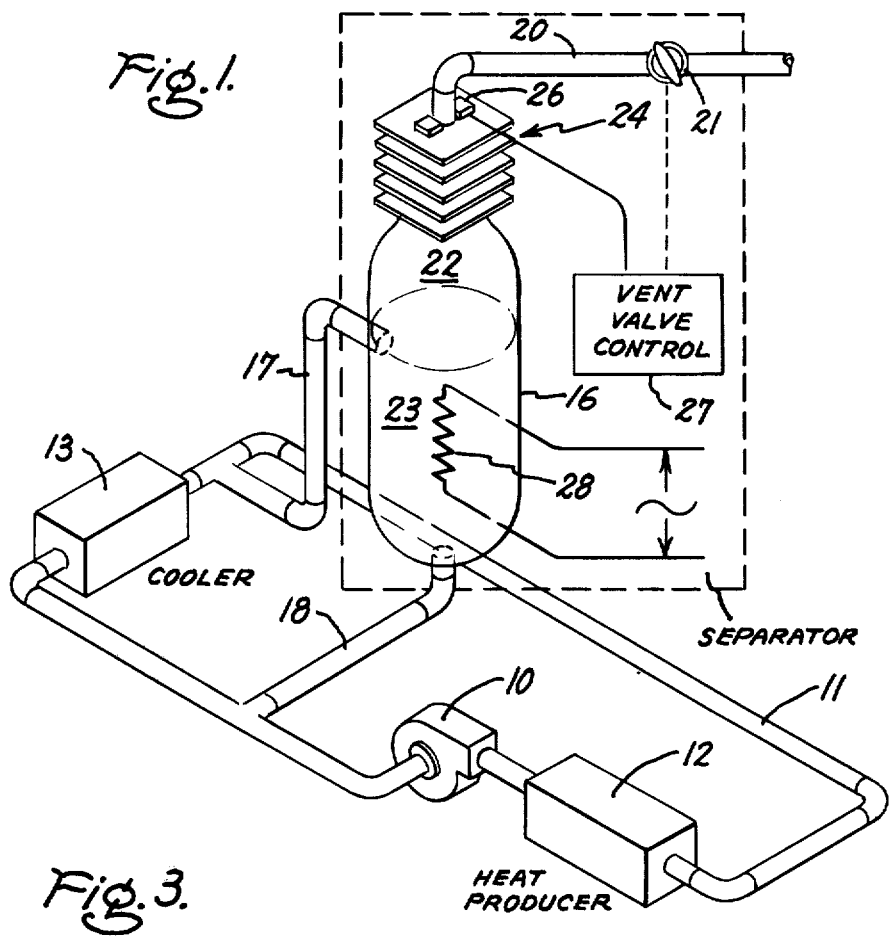
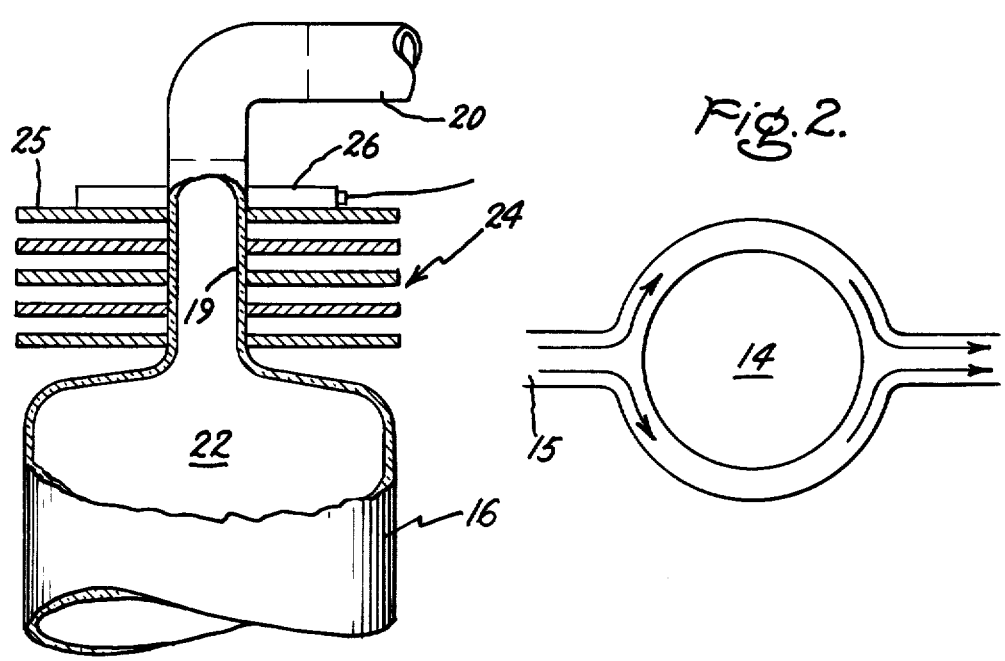

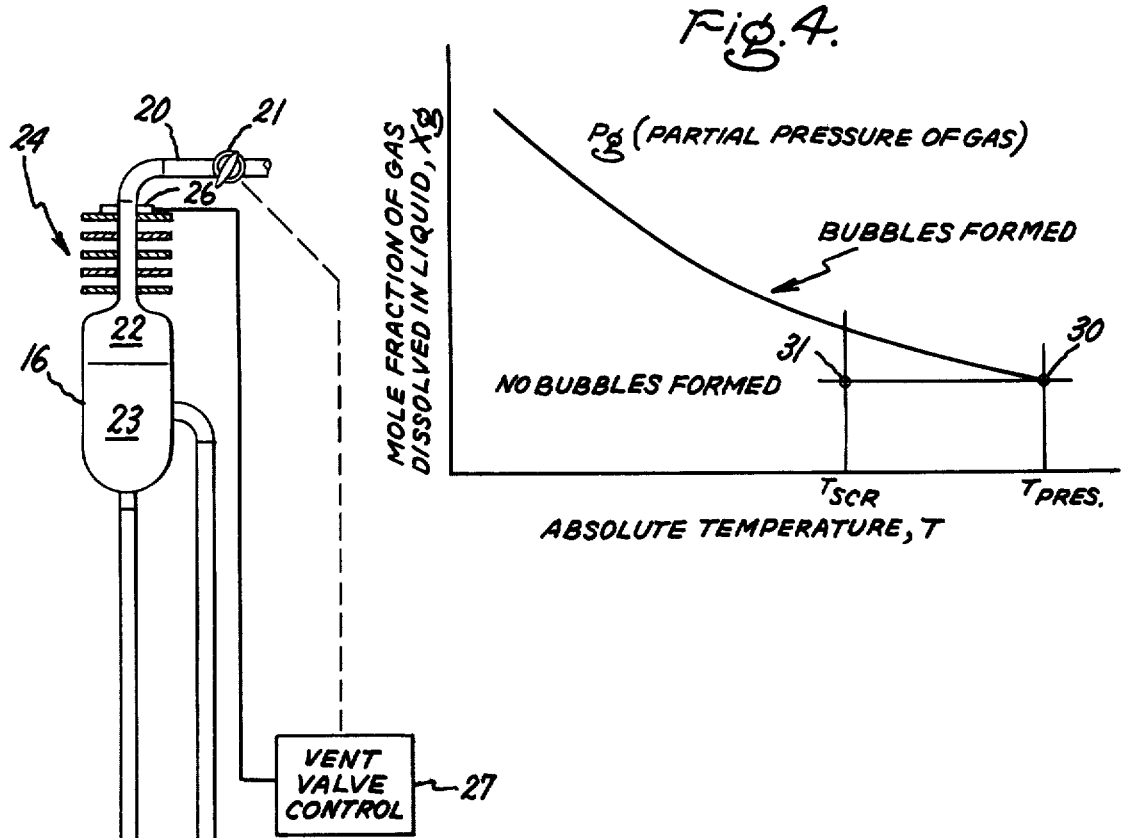

COOLING LIQUID DE-GASSING SYSTEM

This is a division of Ser. No. 515,838, filed Oct. 18, 1974, now U.S. Pat. No. 3,989,102.

BACKGROUND OF THE INVENTION

This invention relates to a pumped cooling liquid system with provision for separation of dissolved gases, and more particularly to a forced cooling system for electronic, electrical, and other equipment having a gas-liquid interface type pressurizer with which is combined a continuous gas separator.

Various types of mechanical, electrical, and chemical equipment are often cooled by means of a pumped cooling liquid. The heated liquid is thereafter passed through a heat exchanger, cooled, and recirculated to cool hot surfaces. In some such closed loop cooling systems the liquid becomes contaminated with gases present in the system that are undesirable from a thermal, electrical, and/or compatibility point view. A simple device is needed which will remove some or all of this dissolved gas continuously and efficiently.

In solid state power conversion equipment, for example, the power silicon controlled rectifiers (SCR's) are immersed in a tank within which cooling liquid is continuously recirculated. If the liquid is pressurized in a conventional way using a pressurizer based on a gas-liquid interface, gas introduced at the pressurizer and also entering through the pipe walls and joints is sufficient to cause high bubble formation rates at the hot surfaces of the SCR's. The bubbles are formed when the fluid absorbs heat, and if the system is not properly controlled can result in dielectric breakdown in areas of high electric stresses or premature nucleation in subcooled boiling. Since a batch gas separator may not be employed, either a complicated pressurizer must be used such as one in which the liquid is separated from the gas by a solid flexible diaphragm, or a continuous gas separator must be included in the coolant system.

SUMMARY OF THE INVENTION

In accordance with the invention, a continuous gas separator is combined with a liquid-gas interface type pressurizer to partially or completely separate dissolved gas from a cooling liquid in a closed loop forced cooling system for various heat producing equipment. By establishing favorable temperature and/or low pressure conditions for preferential gas evolution in the combined separator and pressurizer, the formation of bubbles in the cooling liquid in the main cooling duct loop is prevented. The combined separator and pressurizer is comprised by a pressurizer expansion tank having a vertical exit duct connecting to a gas storage tank, a vertically oriented condenser for liquid recovery mounted to cool the vapor and gas in the exit duct, and means for venting excess gas pressure. Optionally a heating element is provided to raise the temperature of the cooling liquid in the expansion tank. A control system utilizes temperature sensors preferably mounted on the condenser to actuate the pressure venting valve or control the heating element.

In one embodiment, the combined gas separator and pressurizer with a heating element is mounted in a bypass branch of the main cooling duct loop and is elevated and connected between the heat exchanger (cooler) inlet and the pump inlet, to thereby establish favorable higher temperature and low pressure conditions for gas evolution. In a second embodiment, the combined separator and pressurizer is mounted directly in the main cooling duct loop and is elevated a considerable height to establish low pressure conditions for preferential gas evolution.

BRIEF DESCRIPTION OF THE DRAWINGS

FIG. 1 is a schematic diagram of a closed loop forced cooling system for heat providing electronic equipment with a bypass branch for the liquid coolant which incorporates a combined continuous gas separator and pressurizer as herein taught;

FIG. 2 is a sketch illustrating passages for the circulation of cooling liquid into contact with the hot surfaces of the electronic devices being cooled;

FIG. 3 is a sketch partially in side elevation showing a vertical cross section through the condenser and exit duct connecting the pressurizer expansion tank and gas storage tank;

FIG. 4 illustrates, as defined by Henry's Law, a plot of $X_g$ versus T to show that gas evolves at the elevated temperature $T_{pres}$ in the pressurizer but remains in solution at the lower temperature $T_{SCR}$ at the hot electronic device surfaces; and FIG. 5 is a schematic diagram similar to FIG. 1 of another embodiment wherein the combined separator and pressurizer is elevated considerably above and connected directly in the main cooling duct loop.

DESCRIPTION OF THE PREFERRED EMBODIMENTS

The invention has particular utility for the liquid cooling of power electronic and electrical equipment wherein at least a portion of the dielectric coolant is subjected to high voltages and high electrical field stresses of sufficient magnitude that the formation of bubbles in the cooling liquid as heat is being absorbed cannot be tolerated due to the possibility of dielectric breakdown. The preferred embodiment is explained with regard to extremely high voltage alternating current to direct current solid state power conversion equipment, such as a large SCR power rectifier for a 400 KV high voltage d-c transmission line. Another application is a sheet wound power transformer. In its broader aspect, however, the invention has general applicability to other types of heat-producing equipment including mechanical and chemical systems where improved cooling is obtained by controlling the concentration of a gas in the cooling liquid. In the main closed loop forced cooling system, illustrated here at a single level, a pump 10 supplies cooling liquid to a network of pipes or ducts 11 for circulation in contact with hot surfaces of the heat-producing electronic equipment 12, and the heated coolant is cooled by a suitable heat exchanger or cooler 13 before being returned to the pump inlet. In solid state power conversion equipment using SCR's as the electronic devices, each SCR may have as much as 1000 watts in losses. Referring to the sketch in FIG. 2, an SCR heat sink 14 or the SCR itself is represented by a circle of about 2 inches in diameter and is entirely encircled by a suitably fabricated fluid passage 15 for directing the coolant flow past the hot surfaces from which heat is dissipated. In a typical arrangement, a large number of power SCR's are mounted on circuit boards within a large tank and provided with a connected system of ducts for circulating coolant past all of the SCR's. The tank itself is filled with a suitable dielectric insulating gas such as sulfur hexafluoride, $SF_6$. Typically, the cooling liquid is a fluorocarbon such as Freon FR-113 (a trademark of the Dupont Company) having a high capacity to hold gases in solution. Over a period of time there is contamination of the cooling liquid by the outside dielectric insulating gas or by air and other gases in the system. Leakage can be through the pipe joints or, as when the pipes or ducts 11 are made of plastic, by diffusion through the material of the ducts themselves.

In accordance with the invention, a combined continuous gas separator and liquid-gas interface pressurizer are provided in a bypass branch of the main cooling duct loop for circulating a minor portion of the coolant. The pressurizer is provided by an expansion tank or bottle 16 having an inlet duct 17 entering about half way up its height and an outlet duct 18 connecting to the bottom of the tank. It is evident that the preferred location of the bypass branch is that the inlet duct 17 connects to the main cooling duct loop at the inlet of the heat exchanger 13 while the outlet duct 18 is connected at the inlet to the pump 10. Thus, the bulk liquid temperature is highest at the pressurizer inlet while the liquid pressure is lowest at the pressurizer outlet. The upper end of the expansion tank 16 (see also FIG. 3) narrows to a vertical exit duct 19 for the passage of the vapor-gas mixture, and exit duct 19 in turn connects to a horizontal gas storage tank 20 at the end of which is a vent or relief valve 21. The outlet of the valve 21 is to the atmosphere. The space 22 above the level of the liquid coolant 23 in the pressurizer expansion tank 16 is occupied by a mixture of vapor and a suitable dielectric gas under pressure, preferably $SF_6$. The use of a pressurizer expansion tank and accumulator in this cooling system is essential due to the very elastic nature of fluorocarbon type coolants, since there is a large change in liquid density over a typical temperature range for this system of about 90° C. As the liquid expands, the pressurizing gas is simply compressed to provide expansion space. Pressurizing of the coolant is also needed in this system, as will be recognized by those skilled in the art, in order that the cooling liquid can be heated without causing boiling. While the use of a conventional gas-liquid interface type pressurizer is desirable, a disadvantage is that dielectric gas introduced into the coolant in the pressurizer, unless properly controlled and separated as hereafter taught, is likely to be sufficient to cause high bubble formation rates at the hot surfaces of the electronic devices being cooled.

The added components for continuous gas separation, by way of brief mention before discussing the theory and operation, include a vertically oriented condenser 24 for condensing the vapor-gas mixture in the expansion tank exit duct 19. Although other types of vertically oriented condensers can be employed, the condenser 24 here illustrated comprises a plurality of air-cooled or fan-cooled spaced parallel metallic plates 25 encircling the vertical exit duct and assembled to conduct heat from the external duct wall. The vapor component of the mixture condenses and the condensate falls back into the liquid volume in the pressurizer expansion tank 16, while the noncondensable gases are vented to the atmosphere. This can be achieved by using a pressure actuated valve, or by sensing the temperature at the condenser walls using one or more thermocouples 26 or other suitable temperature sensors which actuate a vent valve control 27. As the volume of cooler noncondensable gases increases, the temperature sensors 26 sense the drop in temperature and open the vent valve 21 until the interface with the hotter vapor-gas mixture rises and the higher temperature is again sensed. If not provision were made to include a condenser and thus reduce the fraction of the condensable component in the vapor-gas mixture before venting, large amounts of cooling liquid would be lost and necessitate frequent liquid recharging of the system.

Gas separation of the gases in solution in the coolant under the principles of Henry's law is enhanced by connecting the separator to the main cooling system loop near the pump inlet, thus providing for the liquid in the pressurizer tank 16 to exist at a lower pressure than in the main system loop. Henry's Law in general terms states that the amount of gas that is dissolved in a liquid at a given temperature is a function of the partial pressure of that gas in contact with the liquid. In the space 22 above the cooling liquid 23 in the expansion tank 16, the total pressure is the sum of the partial pressure of vapor and the partial pressure of gas. In this embodiment of the invention, gas separation is facilitated by locally raising the temperature of the cooling liquid 23 in the pressurizer expansion tank 16 to create an environment where evolution of the dissolved gas into the space 22 above the liquid takes place. To this end, a resistive heating element 28 is immersed in the liquid 23 or otherwise arranged to heat the accumulated liquid in the pressurizer expansion tank 16. At lower temperatures, it will be shown, the cooling liquid can hold much more gas in solution than at higher temperatures. The amount of heating is enough to drive sufficient gas out of solution so as not to cause bubbles when circulated at the lower temperature past the heat producing electronic equipment 12, and may be sufficient to raise the liquid in the pressurizer expansion tank to the local saturation temperature, i.e., to cause boiling.

Henry's Law is expressed as $X_g = H(T)P_g$, where $X_g$ and $P_g$ are defined below and $H(T)$ is Henry's parameter. For fluorocarbons and $SF_6$, the particularized applicable equation is:

$$X_g = (aP_g/T^6)$$

where
 $X_g$ is the concentration of gas in the liquid,
 $a$ is a material constant,
 $P_g$ is the partial pressure of the gas, and
 $T$ is the absolute temperature.

For a particular partial pressure of the gas, the relation between $X_g$ and $T$ is shown graphically in FIG. 4, wherein it is evident that less gas can be kept in solution at the higher temperatures. In FIG. 4, the area under the curve represents the conditions under which no bubbles are formed, while the curve itself and the area above represents those conditions under which bubble formation occurs. At the higher pressurizer temperature $T_{pres}$, the value of $X_g$ at which bubbles are evolved is relatively low and indicated by the point 30. At the substantially lower temperature of the liquid adjacent to the SCR being cooled, $T_{SCR}$, this same value of $X_g$ is not high enough to cause bubble formation as is indicated by the horizontal line connected to the point 31. Thus, although there is evolution of gas at the pressurizer temperature, there is no bubble formation at the lower SCR temperatures.

Briefly reviewing the operation of the embodiment of FIG. 1, assuming that the combined separator and pressurizer is only slightly elevated above the height of the main cooling duct loop, the combined separator and pressurizer as previously explained is connected into the main flow loop so that the relatively small amount of the liquid in the separator is at a lower pressure than in the main loop. In the pressurizer expansion tank 16, vapor evolves and gas is released in this low pressure environment as the accumulated liquid is held at an elevated temperature by the heater 28. The vapor-gas mixture in the space 22 above the accumulated liquid 23 flows upwardly through the exit duct 19 where the vapor is condensed by the condenser 24 and the condensate falls back into the main separator volume liquid 23. The gas is trapped in the storage duct tank 20 due to the continuous mass flux upwards and the efficient separation in the vertically oriented condenser. The separation region or interface between the vapor-gas mixture and the gas is held within the region of the condenser by the temperature activated feedback control system. As the increasing pressure in the storage tank 20 displaces the vapor-gas interface downwards in the condenser, the thermocouples 26 on the condenser wall sense a temperature drop as they are exposed to the cooler, noncondensable gas. These sensors actuate the vent valve 21 to open and discharge gas from the storage tank 20 until the vapor gas interface again rises to expose the temperature sensors to the higher vapor temperature. The vent valve control 27 then actuates the valve to close. The same cycle of operation occurs when other conditions in the system cause the gas to expand in the storage tank 20. As for example, an ambient temperature increase or a cooling system pressure decrease in similar manner actuates the vent valve to open. This control system operates when heat flow into the system is reduced, as when the cooling duty is changed or during shut down of the electronic equipment. The control system is needed in general to permit proper cooling system pressure control independent of the gas evolution rate or ambient temperature change.

In the second embodiment of the invention shown in FIG. 5, the auxiliary heater 28 for the liquid accumulated in the pressurizer tank 16 is not used, and the favorable environment and physical conditions for the preferential evolution of gas from the cooling liquid is created by raising the combined separator and pressurizer a considerable height above the main coolant duct loop so that there is a higher pressure in the main flow loop than in the pressurizer tank 16. Thus, the combined pressurizer and separator is sufficiently high above the main flow loop that little gas can be kept in solution in the pressurizer tank 16 due to the low pressure. The difference in pressure due to the hydrostatic head is equal to $\rho gh$, where $\rho$ is the density of cooling liquid, g is gravity, and h is the difference in height in feet. As is evident from the equation for Henry's Law previously given, at the higher partial pressures of gas $P_g$ in the cooling liquid flowing past the heat producing equipment, due to the different in height, the amount of dissolved gas that can be kept in solution is considerably higher than for the accumulated cooling liquid in the pressurizer tank 16. In the pressurizer tank, the partial pressure of gas $P_g$ is much lower and thus the amount of gas that can be kept in solution is relatively low. Accordingly, gas evolves in the favorable low pressure environment, and the system operates as previously explained including the temperature activated feedback control system for actuating the vent valve 21. In this embodiment of the invention, the combination separator and pressurizer is connected directly in the main cooling loop, preferably between the heat producing equipment 12 and heat exchanger 13, so that all the cooling liquid circulates through the expansion tank 16, and thus this arrangement is most suitable for small cooling systems.

It is evident that any combination of pressure and temperature conditions that create a favorable environment for the evolution of gas in the combined separator and pressurizer can be employed. Accordingly, in the embodiment of FIG. 1 where the auxiliary heater is used, the auxiliary heating needs are reduced when the height of the combined separator and pressurizer above the main cooling duct loop is increased.

In summary, a continuously operating, combined separator and pressurizer in a cooling system to prevent th formation of gas bubbles in the liquid coolant has multiple functions. The combined separator-pressurizer in the closed loop liquid cooling system serves as a device to remove gas contamination from the liquid, an accumulator and expansion tank, a heat exchanger, and finally a pressure regulator. By preventing the formation of gas bubbles in a liquid cooling system for electronic and electrical equipment, dielectric breakdown in areas of high electric stresses is prevented.

While the invention has been particularly shown and described with reference to several preferred embodiments thereof, it will be understood by those skilled in the art that various changes in form and details may be made therein without departing from the spirit and scope of the invention.

What is claimed is:

1. A forced liquid cooling system comprising
   a main cooling duct loop for continuously circulating dielectric cooling liquid in a closed path past heat producing equipment to be cooled and including a pump for pumping said cooling liquid and a heat exchanger for cooling said cooling liquid,
   combined continuous gas separator and liquid-gas interface pressurizer means for pressurizing at least a portion of said cooling liquid with dielectric gas and establishing selected physical conditions to obtain preferential evolution of dissolved gas from said cooling liquid, to thereby prevent the formation of bubbles,
   said combined separator and pressurizer means elevated a considerable height above said main cooling duct loop to establish favorable low pressure conditions for gas evolution, and
   said combined separator and pressurizer means comprising a pressurizer expansion tank for said cooling liquid having a vertical exit duct connecting to a gas storage tank, a vertically oriented condenser mounted to cool the vapor and gas in said exit duct, and means for venting excess pressure in said gas storage tank.

2. A cooling system according to claim 1 further including temperature sensors mounted on said vertically oriented condenser, and a control system connected to said temperature sensors for controlling said means for venting excess pressure in said gas storage tank.

* * * * *